(12) United States Patent
Ouyang et al.

(10) Patent No.: US 9,864,276 B2
(45) Date of Patent: Jan. 9, 2018

(54) LASER ANNEALING AND ELECTRIC FIELD

(71) Applicant: Applied Materials, Inc., Santa Clara, CA (US)

(72) Inventors: Christine Y. Ouyang, Santa Clara, CA (US); Ludovic Godet, Sunnyvale, CA (US); Sang Ki Nam, Danville, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/091,247

(22) Filed: Apr. 5, 2016

(65) Prior Publication Data
US 2016/0299435 A1 Oct. 13, 2016

Related U.S. Application Data

(60) Provisional application No. 62/144,173, filed on Apr. 7, 2015.

(51) Int. Cl.
*H01L 21/027* (2006.01)
*G03F 7/20* (2006.01)
*G03F 7/16* (2006.01)

(52) U.S. Cl.
CPC ............ *G03F 7/2053* (2013.01); *G03F 7/168* (2013.01)

(58) Field of Classification Search
CPC ............... G03F 7/70691; G03F 7/3007; H01L 21/67225
USPC ................................................ 430/328, 327
See application file for complete search history.

(56) References Cited

U.S. PATENT DOCUMENTS

| | | | |
|---|---|---|---|
| 6,686,132 B2 | 2/2004 | Cheng et al. | |
| 7,374,867 B2 | 5/2008 | Bristol et al. | |
| 8,829,393 B2 | 9/2014 | Jennings et al. | |
| 2008/0145797 A1* | 6/2008 | Verbeke | G03F 7/16 430/322 |
| 2009/0211523 A1 | 8/2009 | Kuppurao et al. | |
| 2012/0325784 A1 | 12/2012 | Moffatt et al. | |

OTHER PUBLICATIONS

Jung, Byungki, et al., "LWR Reduction and Flow of Chemically Amplified Resist Patterns During Sub-Millisecond Heating", Advances in Resist Materials and Processing Technology XXVIII, vol. 7972, 79722S, 2011. (8 pgs.).
Jung, Byungki, et al. "Kinetic Rates of Thermal Transformations and Diffusion in Polymer Systems Measured during Sub-millisecond Laset-Induced Heating", American Chemical Society, vol. 6, No. 7, pp. 5830-5836, 2012.

* cited by examiner

*Primary Examiner* — Daborah Chacko Davis
(74) *Attorney, Agent, or Firm* — Patterson + Sheridan, LLP

(57) ABSTRACT

A method and apparatus for exposing a photoresist in the presence of an electric field using a high power continuous wave source as a radiation source is disclosed herein. In one embodiment, a processing region includes a stage, a translation mechanism, a continuous wave electromagnetic module, and plurality of electrode assemblies. The continuous wave electromagnetic module includes a continuous wave electromagnetic radiation source in the form of a high power continuous wave electromagnetic laser. An electric field is applied to the surface of the substrate using the plurality of electrode assemblies while the continuous wave electromagnetic radiation source selectively irradiates the surface of the substrate.

20 Claims, 9 Drawing Sheets

LASER ANNEALING AND ELECTRIC FIELD

CROSS-REFERENCE TO RELATED APPLICATIONS

This application claims priority from U.S. Provisional Application Ser. No. 62/144,173, filed Apr. 7, 2015, which is hereby incorporated by reference in its entirety.

FIELD

The present disclosure generally relates to a method and apparatus for processing a substrate. Specifically, the present disclosure relates to a method and apparatus for controlling line width variability in a photoresist patterning process.

BACKGROUND

Integrated circuits have evolved into complex devices that can include millions of components (e.g., transistors, capacitors, and resistors) on a single chip. Photolithography may be used to form components on a chip. Generally the process of photolithography involves a few basic stages. Initially, a photoresist layer is formed on a substrate. The photoresist layer may be formed by, for example, spin-coating. A chemically amplified photoresist may include a resist resin and a photoacid generator. The photoacid generator, upon exposure to electromagnetic radiation in the subsequent exposure stage, alters the chemistry of the exposed portion of the photoresist, for example solubility or chemical reactivity, in the development process. The electromagnetic radiation may have any suitable wavelength, such as a wavelength in the extreme ultra violet region. The electromagnetic radiation may be from any suitable source, such as, for example, a 193 nm ArF laser, an electron beam, an ion beam, or other source. Excess solvent used during the coating process may be removed in a pre-exposure bake process.

FIG. 1 depicts a photoresist layer 100 on a material layer 102 formed on a substrate 104 during a prior art photolithography exposure process. Photoacid 108 is generated in an irradiated region 106 when a photoacid generator is exposed to a radiation 105. The radiation 105 has an effect of forming latent image lines 101 in the photoresist layer 100.

The photoacid 108 is primarily generated in the first region 106 of the photoresist layer 100 during light exposure processing. During the post exposure bake process, movement of the photoacid is generally random and the interface between areas within the photoresist layer 100 that include the generated photoacid 108 and areas that do not include the generated photoacid comprise an unclear boundary. For example, the random movement may result in at least a portion of the photoacid 108 diffusing into a second region 110 that may not be irradiated. The unintended diffusion may create undesired wiggling and/or an undesired roughness profile. As a result, the unintended diffusion may result in inaccurate feature transfer to the target material, which may lead to device failure and/or loss.

Therefore, there is a need for a method and apparatus to control edge straightness in latent image lines in the photoresist layer.

SUMMARY

In one embodiment, a processing chamber for processing a substrate is disclosed herein. The processing chamber includes a stage, a translation mechanism, a continuous wave electromagnetic module, and a plurality of electrode assemblies. The stage includes a substrate support surface. The translation mechanism is configured to translate the stage or the continuous wave electromagnetic radiation source. The continuous wave electromagnetic module is configured to heat a surface of the substrate. The continuous wave electromagnetic module includes a continuous wave electromagnetic radiation source. The continuous wave electromagnetic radiation source is a continuous wave electromagnetic laser. The plurality of electrode assemblies is configured to surround the stage and create an electric field about the substrate support surface.

In another embodiment, a method of processing a substrate is disclosed herein. The method includes applying a photoresist layer to a substrate positioned in a processing chamber; providing an electric field to the photoresist layer disposed on the substrate; scanning a surface of the substrate with a continuous wave electromagnetic radiation source, wherein the continuous wave electromagnetic radiation source is a continuous wave electromagnetic laser; and selectively irradiating the surface of the substrate with the continuous wave electromagnetic radiation source.

In another embodiment, a processing chamber for processing a substrate is disclosed herein. The processing chamber includes a stage, a translation mechanism, a continuous wave electromagnetic module, and a plurality of electrode assemblies. The stage includes a substrate support surface. The translation mechanism is configured to translate the stage or the continuous wave electromagnetic radiation source. The continuous wave electromagnetic module is configured to heat a surface of the substrate. The continuous wave electromagnetic module includes a continuous wave electromagnetic radiation source and a focusing optic. The continuous wave electromagnetic radiation source is a continuous wave electromagnetic laser. The focusing optic is disposed between the continuous wave electromagnetic radiation source and the stage. The plurality of electrode assemblies is configured to surround the stage and create an electric field about the surface of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
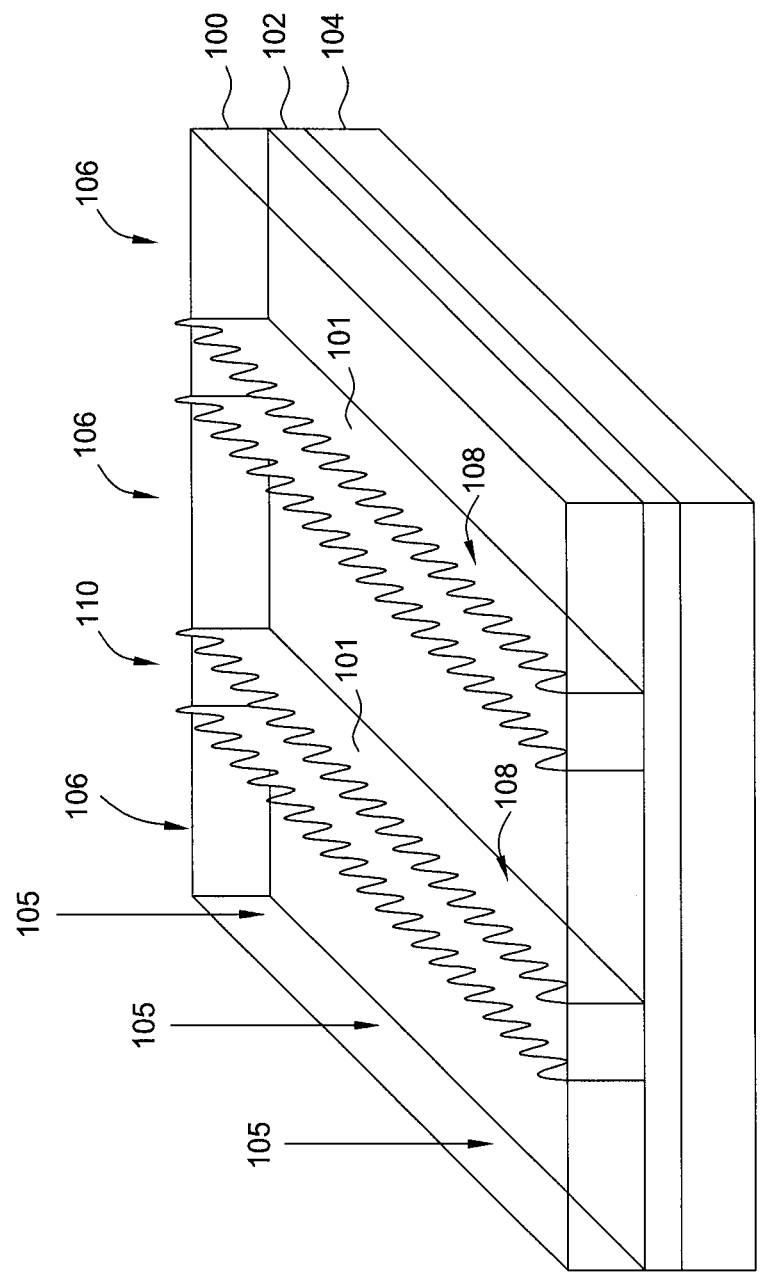
FIG. 1 illustrates a photoresist layer on a material layer formed on a substrate during a prior art photolithography exposure process.
Figure 2A:
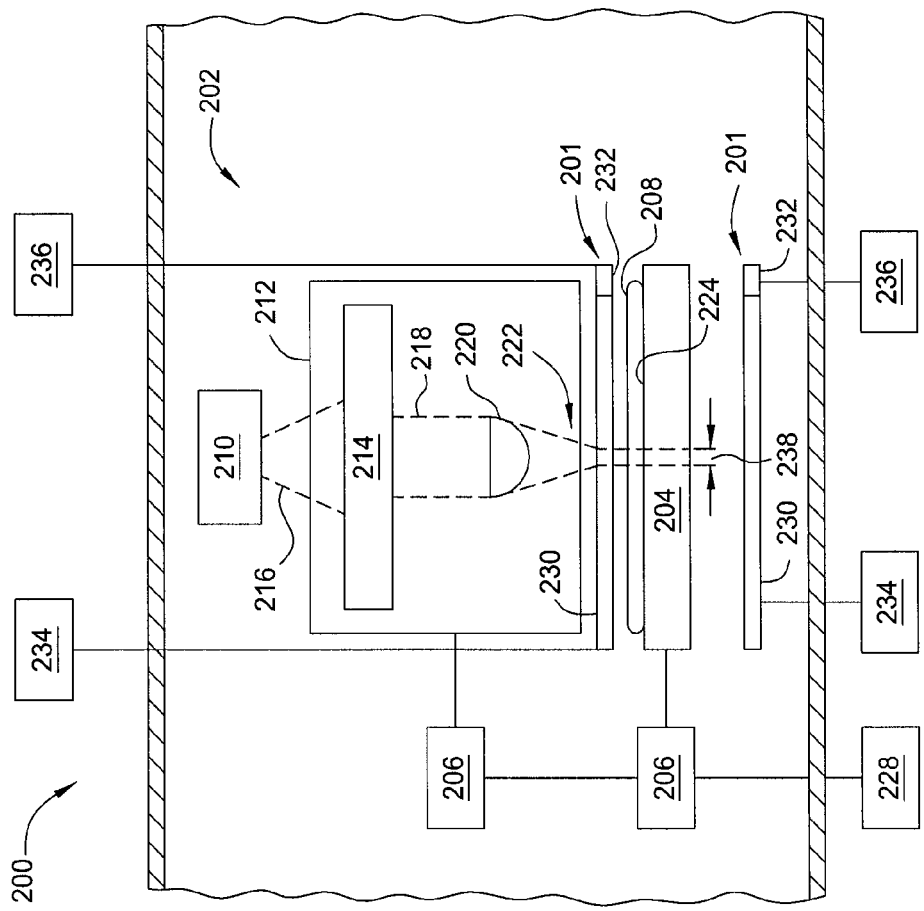
FIG. 2A is a diagrammatic side view of a processing chamber where a thermal exposure process may be performed, according to an embodiment of the invention.

FIG. 2A is a diagrammatic side view of a processing chamber 200 where a thermal exposure process may be performed, according to an embodiment of the invention. Thermally processing a substrate means conducting any thermal process that requires the characteristics of the invention described below. Exemplary embodiments of such a thermal process include thermal annealing of substrates or thermal processes used in chemical vapor deposition (CVD).

The processing chamber 200 includes a continuous wave electromagnetic radiation module 202, a stage 204, at least one electrode assembly 201, and a translation mechanism 206. The stage 204 is configured to receive a substrate 208 thereon. The continuous wave electromagnetic radiation module 202 includes a continuous wave electromagnetic radiation source 210 and focusing optics 212. The focusing optics 212 are disposed between the continuous wave electromagnetic radiation source 210 and the stage 204.

In one embodiment, the substrate 208 is any suitable substrate, such as a single crystal silicon substrate; silicon on insulator (S01); silicon germanium or alloys thereof; glass or quartz substrate with a silicon layer thereon, as used for manufacturing thin film transistors (TFT); or the like. The substrate may be coated with a photoresist material.

The continuous wave electromagnetic radiation source 210 is capable of emitting "continuous waves" or rays of electromagnetic radiation, such as light. By "continuous wave" it is meant that the radiation source is configured to emit radiation continuously, i.e. not a burst, pulse, or flash of radiation. In one embodiment, the continuous wave electromagnetic radiation source 210 is a high power continuous wave electromagnetic laser source may be used. The laser source may be one emitter of laser light or a plurality of laser emitters. In another embodiment, the continuous wave electromagnetic radiation source 210 may be a plurality of light-emitting diodes. The emitters may be selected based on emissivity of the resist material to be patterned. In such embodiments, wavelengths produced by the continuous wave electromagnetic radiation sources may be strongly absorbed by the substrate.

The electromagnetic radiation source 210 may be a solid state laser. In one embodiment, the laser is a neodymium doped yttrium aluminum garnet (Nd:YAG laser) frequency-doubled pulsed laser. For example, the Nd:YAG laser may have a wavelength of approximately 532 nm. In another embodiment, the laser source is a solid state laser. In other embodiments of solid state lasers, a titanium-sapphire (Ti:sapphire) laser, a neodymium glass (Nd:glass) laser, an yttrium glass (Yt:glass) laser, an alexandrite laser, a uranium calcium fluoride (U:CaF) laser, or the like, may be used. In another embodiment, the laser is a diode laser. In yet another embodiment, the electromagnetic radiation source 210 is an excimer laser. For example, a xenon fluoride (XeF) laser having a wavelength of 351 nm or a xenon chloride (XeCl) having a wavelength of 308 nm. In yet another embodiment, the electromagnetic radiation source 210 is a semiconductor laser. for example, a gallium nitride (GaN) laser.

In one embodiment, the continuous wave electromagnetic radiation source 210 is capable of emitting radiation continuously for at least about 300 sec. In another embodiment, the continuous wave electromagnetic radiation source 210 includes multiple laser diodes arranged, for example, in an array. Each laser diode may produce light at a wavelength of 810 nm. The radiation emitted by the continuous wave electromagnetic radiation source 210 may have any desired coherence length, divergence, or modality, and optics such as diffusers, homogenizers, mode scramblers, and the like may be used to increase uniformity and/or decrease coherence of the light, if desired.

In general, the continuous wave electromagnetic radiation source 210 may emit electromagnetic radiation in wavelengths from the deep UV to infrared at a fluence or power level selected to cause a chemical or physical reaction in the substrate. In the embodiments described herein, the continuous wave electromagnetic radiation source 210 delivers power from about 1 W to about 1 kW, such as from about 10 W to about 500 W, for example about 200 W.

The focusing optics 212 may include one or more collimators 214. The collimators 214 collimate radiation 216 from the continuous wave electromagnetic radiation source 210 into a substantially parallel beam 218. The collimate radiation 216 is then focused by at least one lens 220 into a line of radiation 222 at an upper surface 224 of the substrate 208.

Lens 220 is any suitable lens, or series of lenses, capable of focusing radiation into a line. In one embodiment, lens 220 is a cylindrical lens. Alternatively, lens 220 may be one or more concave lenses, convex lenses, plane mirrors, concave mirrors, convex mirrors, refractive lenses, diffractive lenses, Fresnel lenses, Fourier lenses, gradient index lenses, f-θ lenses, or the like. The focusing optics 212 is described in further detail in FIG. 6.

The stage 204 is any platform or chuck capable of securely holding the substrate 208 during translation. In one embodiment, the stage 204 includes a mean for grasping the substrate 208, such as frictional, gravitational, mechanical, or electrical system. Examples of suitable means for grasping the substrate 208 include mechanical clamps, electrostatic or vacuum chucks, or the like.

The processing chamber 200 further includes a translation mechanism 206. The translation mechanism 206 is configured to translate the stage 204 and the line of radiation 222 relative to one another. In one embodiment, the translation mechanism 206 is coupled to the stage 204 to move the stage 204 relative to the continuous wave electromagnetic radiation source 210 and/or the focusing optics 212. In another embodiment, the translation mechanism 206 is coupled to both the continuous wave electromagnetic radiation source 210 and the focusing optics 212 to move the continuous wave electromagnetic radiation source 210 and/or the focusing optics 212 relative to the stage 204. In another embodiment, the translation mechanism 206 moves the continuous wave electromagnetic radiation source 210, the focusing optics 212, and the stage 204. Any suitable translation mechanism may be used, such as a conveyor system, rack and pinion system, or the like.

The translation mechanism 206 is preferably coupled to a controller 228. The controller 228 controls the scan speed at which the stage 204 and the line of radiation 222 move relative to one another. Additionally, translation of the stage 204 and the line of radiation 222 relative to one another are preferably along a path perpendicular to the line of radiation 222 and parallel to the upper surface 224 of the substrate 208. In one embodiment, the translation mechanism 206 moves at a constant speed. Preferably, the constant speed is approximately, for example, between 5 mm/s and 300 mm/s. In another embodiment, the translation mechanism 206 moves at a variable speed, for example, between 5 mm/s and 300 mm/s. In another embodiment, the translation of the stage 204 and the line of radiation 222 relative to one another are not along a path perpendicular to the line of radiation 222.

The electrode assembly 201 is configured to provide an electric field to the substrate 208 as the substrate 208 is being processed in the processing chamber 200. The electrode assembly 201 includes at least a first electrode 230 and a second electrode 232. The first electrode 230 is coupled to a power source 234. The second electrode 232 is coupled to a power supply 236. Electrode assemblies 201 are provided both above the stage 204 and below the stage 204 in order to provide a desired electric field configuration. Thus, the electrode assemblies 201 are both above and below the substrate 208. The electrode assemblies 201 are configured to generate an electric field to the upper surface 224 of the substrate 208.

The power source 234 and the power supply 236 may have various characteristics in order to provide the electric field, as described above. For example, the power source 234 and the power supply 236 may be configured to 0~+/−60 kV.

Figure 2B:
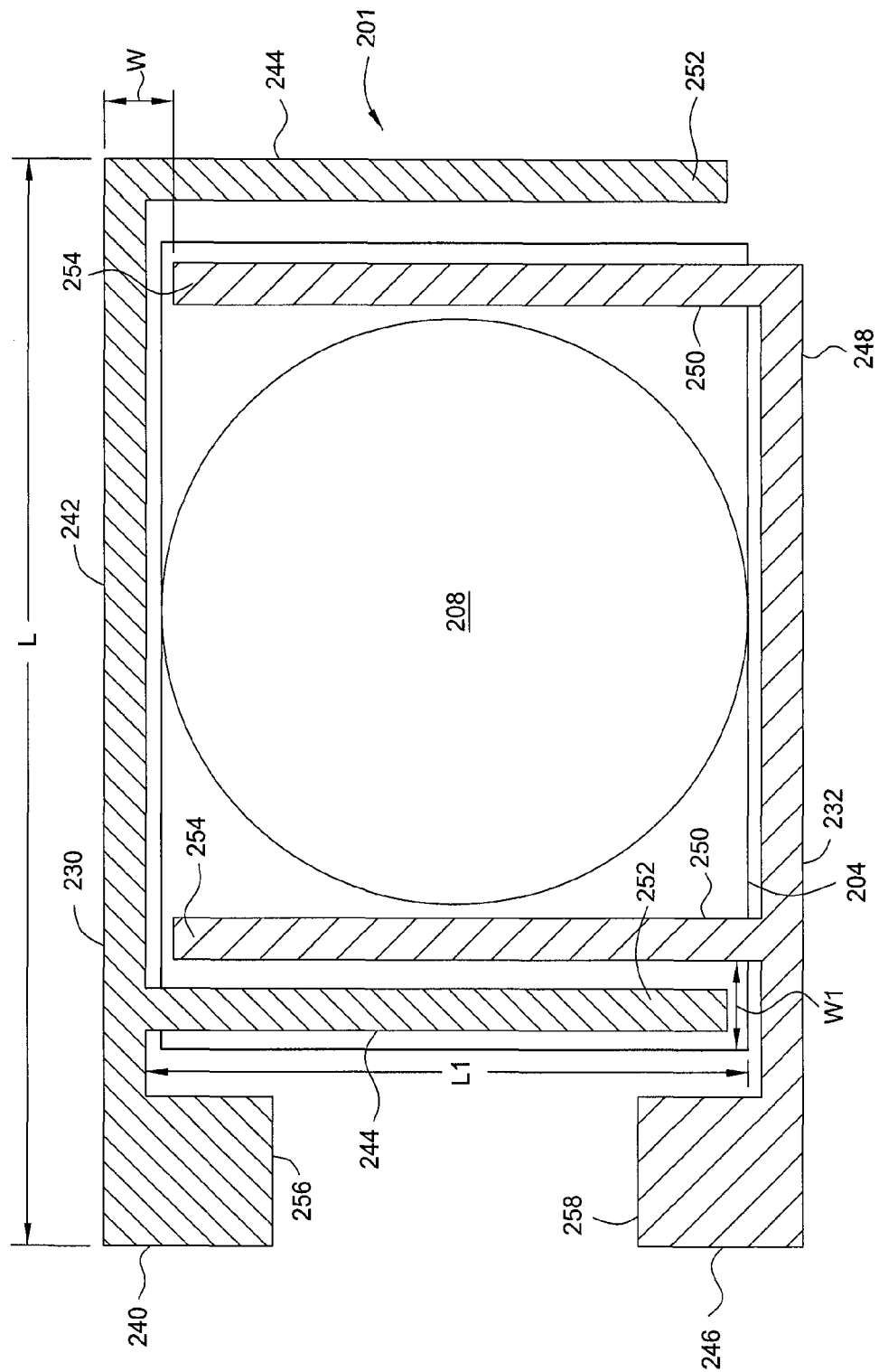
FIG. 2B is a diagrammatic top view of the substrate and the stage of FIG. 2A.

FIG. 2B is a diagrammatic top view of the substrate 208 and the stage 204. In one embodiment, the substrate 208 is a circular substrate with a diameter of 200 or 300 mm, and a thickness of 750 microns. The line of radiation 222 extends across the substrate 208. The line of radiation 222 has a width 238 of between about 1 mm and about 50 mm, for example about 12 mm. The width 238 is measured at half the maximum intensity of the radiation. The length of the line of radiation 222 may be longer than its width 238.

The electrode assembly 201, as shown in FIG. 2B, includes at least the first electrode 230 and the second electrode 232. The first electrode 230 includes a first terminal 240, a first support structure 242, and one or more antennas 244. The second electrode 232 includes a second terminal 246, a second support structure 248, and one or more antennas 250. The first terminal 240, the first support structure 242, and the antennas 244 may form a unitary body. Alternatively, the first electrode 230 may include separate portions that may be coupled together. The second electrode 232 may similarly be unitary body or be comprised of separate detachable components. The first electrode 230 and the second electrode 232 may be prepared by any suitable means. For example, the first electrode 230 and the second electrode 232 may be fabricated by machining, casting, or additive manufacturing.

The first support structure 242 may be made from a conductive material, such as metal. For example, the first support structure 242 may be made of silicon, polysilicon, silicon carbide, molybdenum, aluminum, copper, graphite, silver, platinum, gold, palladium, zinc, or other suitable material. The first support structure 242 may have any desired dimensions. For example, the length L of the first support structure 242 may be between about 25 mm and about 450 mm, for example, between about 200 mm and about 300 mm. In another embodiment, the first support structure 242 has a length L approximately equal to a diameter of a standard semiconductor substrate.

The second support structure 248 may be made of the same materials as the first support structure 242. The range of dimensions suitable for the first support structure 242 is also suitable for the second support structure 248. In some embodiments, the first support structure 242 and the second support structure 248 are made of the same material. In another embodiment, the first support structure 242 and the second support structure 248 are made of different materials. The lengths L, widths W, and thicknesses of the first support structure 242 and the second support structure 248 may be the same or different.

The one or more antennas 244 of the first electrode 230 may also be made from a conductive material. The one or more antennas 244 may be made from the same materials as the first support structure 242. The one or more antennas 244 of the first electrode 230 may have any desired dimensions. For example, a length L1 of the one or more antennas 244 may be between about 25 and about 450 mm, for example, between about 200 mm and about 300 mm. In some embodiments, the one or more antennas 244 may have a length L1 equal to the diameter of the substrate 208.

Each of the antennas 244 may have the same dimensions. Alternatively, some of the one or more antennas 244 may have different dimensions than one or more of the other antennas 244. Each of the one or more antennas 244 may be made of the same material. In another embodiment, some of the antennas 244 may be made of a different material than other antennas 244.

The antennas 250 may be made of the same range of materials as the antennas 244. The range of dimensions suitable for the antennas 244 is also suitable for the antennas 250. In some embodiments, the antennas 244 and the antennas 250 are made of the same material. In other embodiments, the antennas 244 and the antennas 250 are made of different materials. The lengths L1, widths W1, and thicknesses of the antennas 244 and the antennas 250 may be the same or different.

Each of the antennas 244 has a terminal end 252. Each of the antennas 250 has a terminal end 254. In another embodiment, the first electrode 230 has a first terminal 256, and the second electrode 232 has a second terminal 258. The first terminal 256 may be a contact between the first electrode 230 and the power source 234, the power supply 236, or a ground. The second terminal 258 may be a contact between the second electrode 232 and the power source 234, the power supply 236, or a ground. The first terminal 256 and the second terminal 258 are shown as being at one end of the first electrode 230 and the second electrode 232, respectively.

In operation, a voltage may be supplied from a power supply, such as the power source 234 or the power supply 236, to the first terminal 256 or the second terminal 258. The supplied voltage creates an electric field between each antenna of the one or more antennas 244 and each antenna of the one or more antennas 250. The spatial relationship of the antennas 244, 250 produces an electric field predominantly in a direction parallel to the plane defined by the surface of the stage 204. To create an electric field predominantly in the direction parallel to the plane defined by the surface of the stage 204, the voltages of the electrodes 230, 232 need to be set. The first electrodes 230 may have substantially the same voltage, which may be a positive voltage. The second electrodes 232 may also have substantially the same voltage, which may be a negative voltage.

The configuration shown in FIG. 2B, in which two vertically aligned "positive" electrodes and two vertically aligned "negative" electrodes are present above and below the stage 204, forms an electric field with desirable characteristics, in which the electric field is parallel to the surface of the stage 204. The substrate 208 is positioned on the stage 204 such that the latent image lines are parallel to the electric field lines generated by the electrode assembly 201. The charged species are affected by the electric field because the charged species are charged. The electric field drives the charged species generated by the photoacid generators in the photoresist layer in the direction of the electric field. The line edge roughness may be reduced by driving the charged species in a direction parallel with the latent image lines. In contrast, when a voltage is not applied to the first terminal 256 or the second terminal 258, an electric field is not created to drive the charged species in any particular direction. As a result, the charged species may move randomly, resulting in increased line edge roughness.

In another embodiment, the electrodes 230, 232 may be configured to form an electric field predominantly in a direction perpendicular to the plane defined by the surface of the stage 204. To create an electric field predominantly in the direction perpendicular to the plane defined by the surface of the stage 204, the voltages of the electrodes 230, 232 may be set differently than in the prior embodiment. For example, the first electrodes 230 may have opposite voltages. For example, one first electrode 230 may have a positive voltage and the other first electrode 230 may have a negative voltage. The second electrodes 232 may also have opposite voltages. For example, one second electrode 232 may have a positive voltage and the other second electrode 232 may have a negative voltage. The configuration shown in FIG. 2B, in which two horizontally aligned "positive" electrodes and two horizontally aligned "negative" electrodes are present above and below the stage 204, forms an electric field with desirable characteristics, in which the electric field is perpendicular to the surface of the stage 204.

In yet another embodiment, the electrodes 230, 232 may be configured to form an electric field predominantly in a direction not perpendicular and not parallel to the plane defined by the surface of the stage 204. Rather, the electrodes 230, 232 are configured to form an electric field in a direction between 0 degrees and 90 degrees with respect to the plane defined by the surface of the stage 204.

Figure 3:
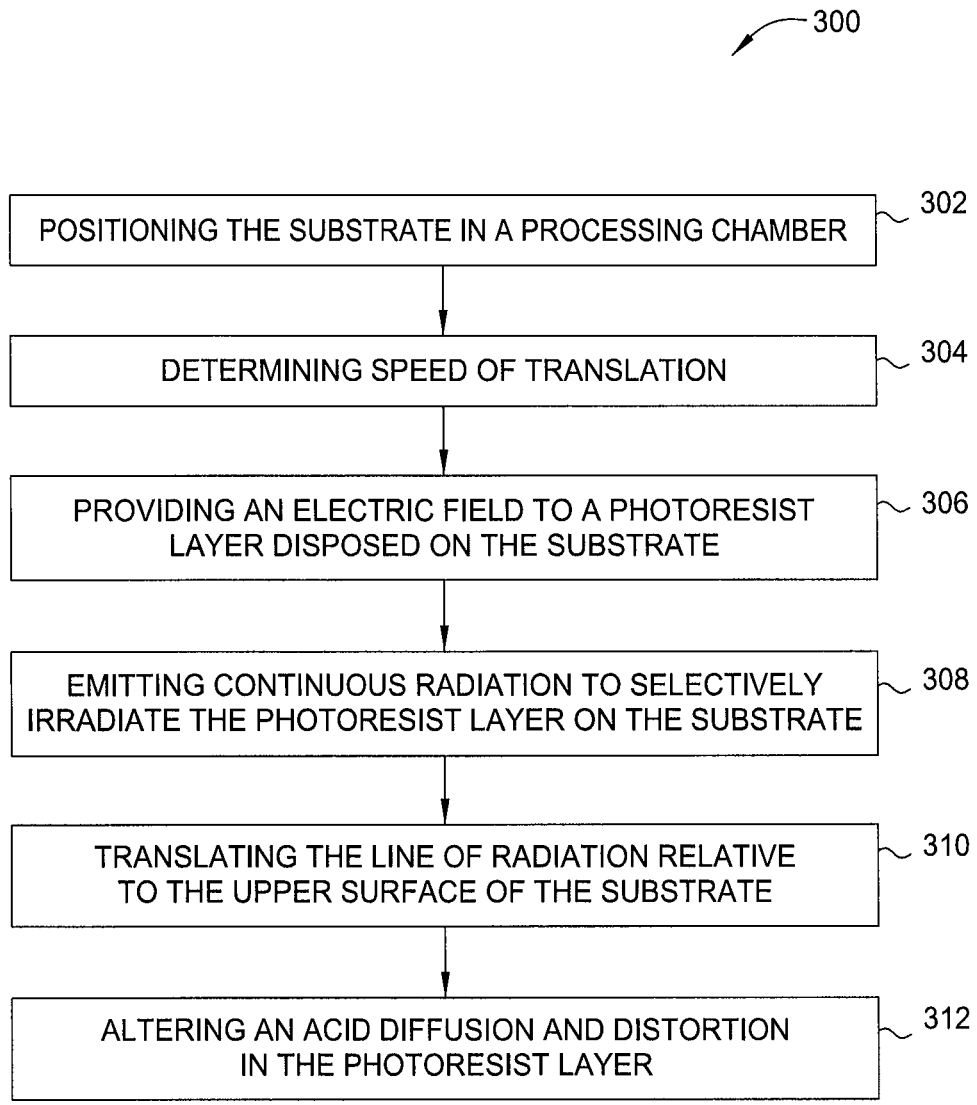
FIG. 3 depicts a flow diagram of a method for controlling photoacid distribution/diffusion in a photoresist layer during a post-baking process.

FIG. 3 depicts a flow diagram of a method 300 for controlling photoacid distribution/diffusion in a photoresist layer during a post-baking process. The method 300 begins at block 302 by positioning a substrate, such as substrate 208 described above, into a processing chamber, such as the processing chamber 200 in FIG. 2A. At block 304, a predetermined speed for translating a line of radiation is optionally determined. The predetermined speed is based on a number of factors, such as thermal recipe for processing the substrate, the properties of the substrate, a power of the continuous wave electromagnetic radiation, a width of the line of radiation, a power density at the line of radiation or the like.

At block 306, after the substrate 208 is positioned on the stage 204, an electric field is applied to the processing chamber to control the photoacid movement that occurs in a photoresist layer disposed on the substrate when the photoresist layer is heated by the continuous wave electromagnetic radiation source 210. The photoacid that is generated may move primarily in a single plane, to reduce the likelihood of the photoacid diffusing into a region in which photoacid is not intended to be included. By utilizing directional control of photoacid distribution, a photoresist layer with a well-defined edge profile having substantially no blurring, having high resolution, and having reduced line edge roughness may be obtained.

At block 308 a continuous wave electromagnetic radiation is emitted from a continuous wave electromagnetic radiation source 210 as described above. The continuous wave electromagnetic radiation is used to selectively irradiate the photoresist layer formed on the substrate 208. The continuous wave electromagnetic radiation is preferably collimated by the collimator 214. The continuous wave electromagnetic radiation is subsequently focused into a line of radiation 222 extending across the upper surface 224 of the substrate 208. In one embodiment, the width 238 of the line of radiation 222 is approximately 12 mm. The line of radiation is then translated at block 310 relative to the upper surface 224 at the constant predetermined speed, as optionally determined in block 302. The translation is undertaken by the translation mechanism 206 under the control of the controller 228.

At block 312, the irradiated portions on the surface of the substrate alter the acid diffusion and distribution in the photoresist layer such that latent image lines are formed in the photoresist layer. The electric field generated in block 306 aids in controlling the direction of the latent image lines such that the latent image lines have a well-defined edge profile. The result of method 300 can be seen in FIG. 7 below.

Figure 4:
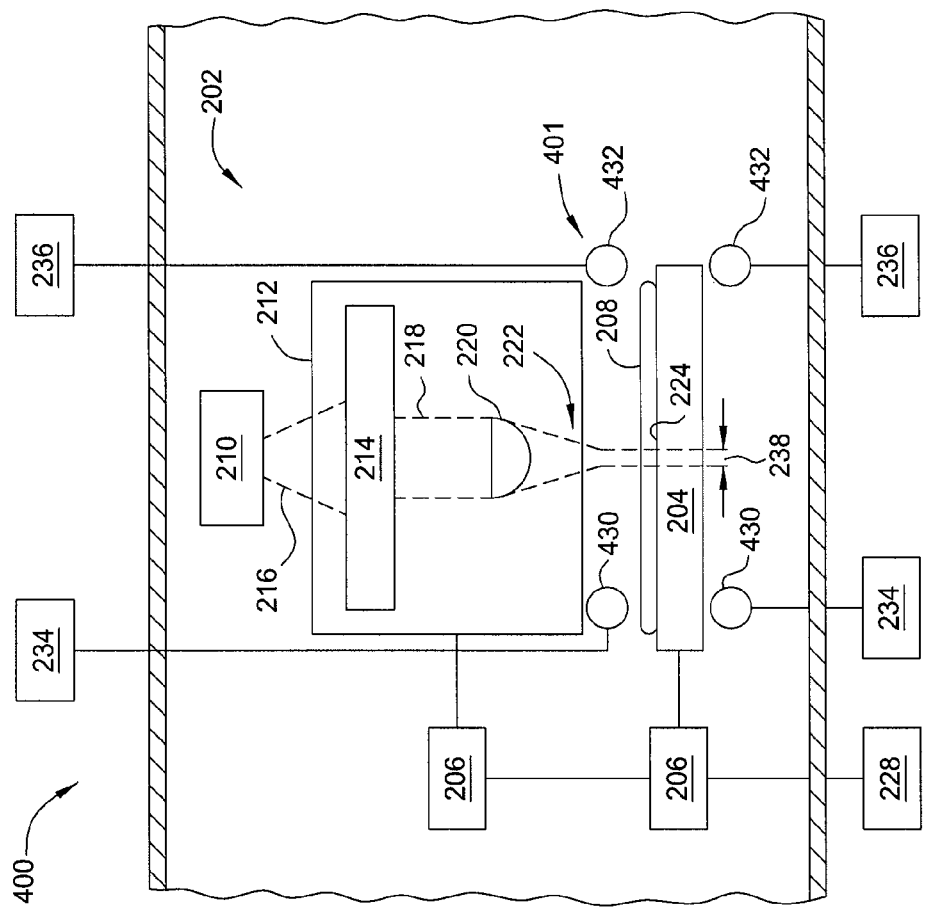
FIG. 4 illustrates another embodiment of a processing chamber where a post exposure bake procedure may be formed.

FIG. 4 illustrates another embodiment of a processing chamber 400 where a post exposure bake procedure may be formed. The processing chamber 400 is similar to the processing chamber 200 shown in FIGS. 2A and 2B. Like-named components are similar except for any differences described below.

The processing chamber 400 differs from the processing chamber 200 in its arrangement of the electrode assembly 401. The electrode assembly 401 includes a first electrode 430 and a second electrode 432. The electrode assembly 401 may be disposed in the processing chamber 400 such that the antennas (not shown) are perpendicular to the range of motion. Such positioning of the electrode assembly 401 may change the orientation of the electrode field over the upper surface 224 of the substrate 208.

Figure 5:
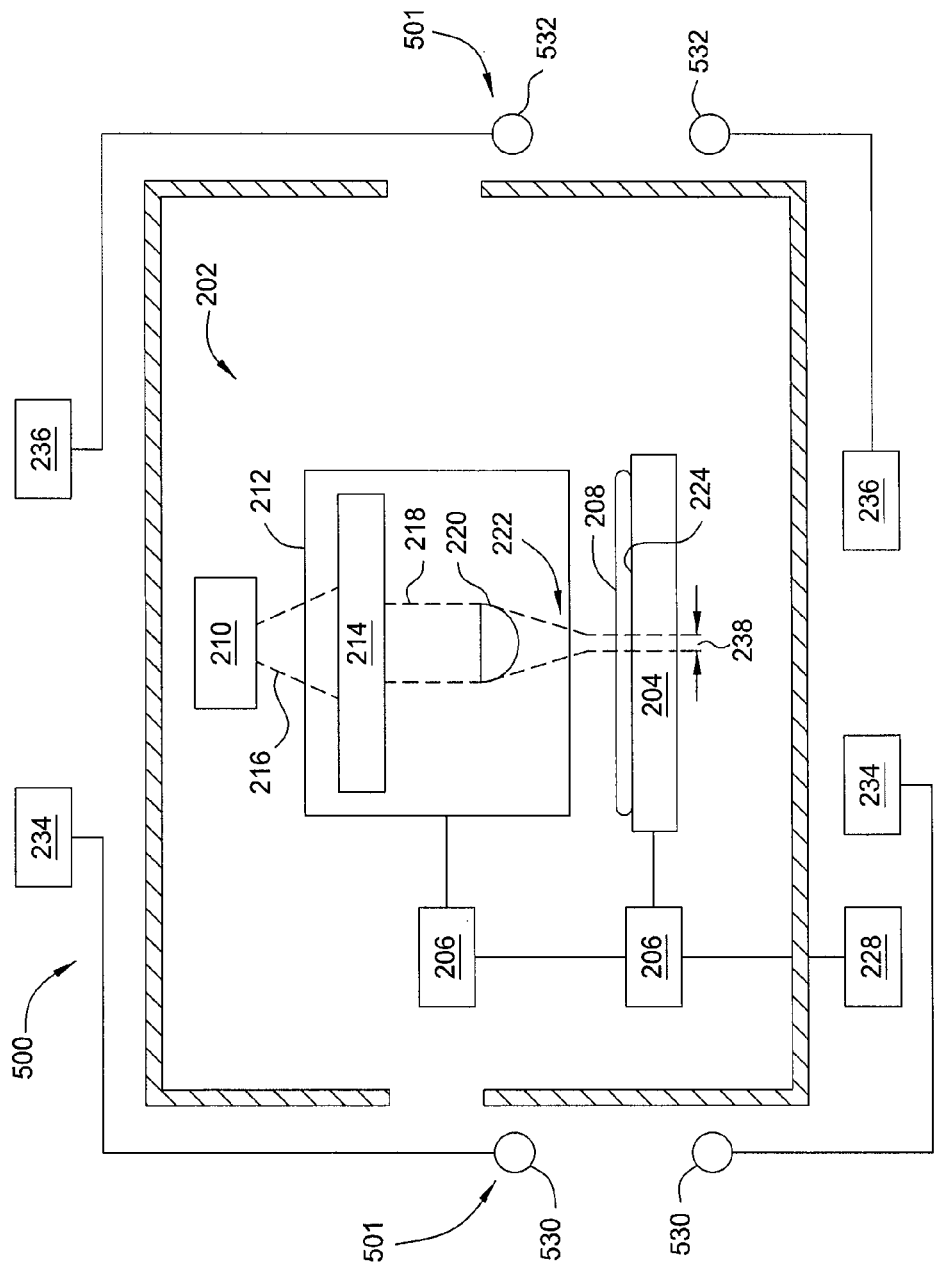
FIG. 5 illustrates another embodiment of a processing chamber where a post exposure bake procedure may be formed.

FIG. 5 illustrates another embodiment of a processing chamber 500 where a post exposure bake procedure may be formed. The processing chamber 500 is similar to the processing chamber 200 shown in FIGS. 2A and 2B. Like-named components are similar except for any differences described below.

The processing chamber 500 differs from the processing chamber 200 in its arrangement and location of the electrode assembly 501. The electrode assembly 501 may be disposed exterior to the processing chamber 500. Such positioning of the electrode assembly 501 allows for direct contact with the electrode assembly 501. The electrode assembly 501 includes a first electrode 530 and a second electrode 532.

Figure 6:
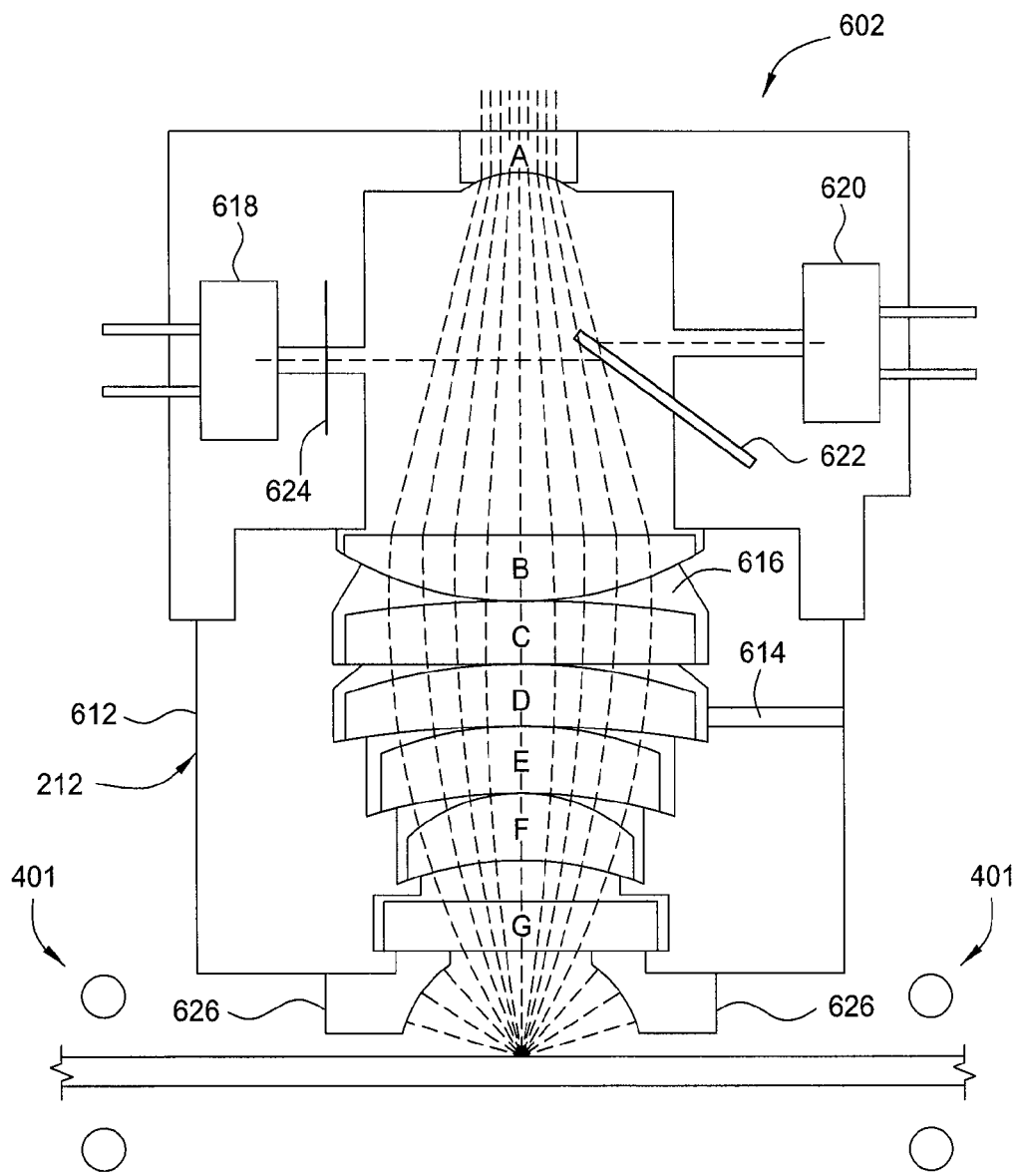
FIG. 6 is a more detailed side view of the focusing optic and the detection module of FIG. 2A.

FIG. 6 is a more detailed side view of the focusing optic 212 and the detection module 602. The purpose of the focusing optic 212 is to focus continuous wave electromagnetic radiation emitted from the continuous wave electromagnetic radiation source 210 into a line of continuous wave radiation on the surface of the substrate 208. In one embodiment, the focusing optics 212 includes a series of seven lenses, labeled as A-G. All of the lenses A-G are preferably cylindrical lenses having spherical, or Plano, figure. Such cylindrical lenses having spherical or Plano figure are selected for their relative ease, and low cost, of manufacture, as compared to cylindrical lenses having spherical or Plano figure shown. In addition, besides focusing the line of continuous wave electromagnetic radiation, the totality of the cylindrical lenses significantly reduces any optical aberrations.

Also, in one embodiment, lens A is an expander lens that has a substantially optically flat entry side and a cylindrical exit side. The expander lens is used to expand the continuous wave electromagnetic radiation condensed by an interleave combiner for subsequent focusing by the remainder of the focusing lenses B-G. For example, in a preferred embodiment, the beam of continuous wave electromagnetic radiation is expanded to 10 nm wide and the fast axis divergence is reduced to less than 0.1 degree. The reduced divergence makes it possible to achieve a narrower line width. Once focused by the remainder of the lenses B-G, the resulting beam is approximately 10 nm [check this] wide at the surface of the substrate 208.

The final lens G preferably has opposing substantially optically flat entry and exit sides, and acts as a quartz window to isolate the wafer environment from the lens environment. The final lens G also shifts the focus somewhat away from the radiation source.

The lenses A-G may be held in place within the focusing optics 212 by a frame 612. In one embodiment, the frame 612 is made from machined stainless steel. The frame 612 also preferably includes some tolerances to ensure a robust system should the lenses not align in use, where any misalignment merely shifts the line of focus towards or away from the substrate surface (or it moves laterally). The shift in focus may then be adjusted by an automated focusing system (not shown). In addition, during one embodiment, purge gas may be pumped into the frame 612 and through a gas injector 614 into spaces 616 between the lenses A-G to keep the lenses A-G cool. The purge gas may be, for example, nitrogen.

The detection module 602 may include at least one reflected power detector 618 and at least one emitted power detector 620. The at least one emitted power detector 620 is configured to detect a portion of the emitted continuous wave electromagnetic radiation emitted from the continuous wave electromagnetic radiation source, while the at least one reflected power detector 618 is configured to detect a portion of reflected continuous wave electromagnetic radiation reflected from the surface of the substrate 208. The emitted power detector 620 monitors the output of the continuous wave electromagnetic radiation source 210, while the reflected power detector 618 is used to detect reflectivity, emissivity, energy absorbed by the substrate, and/or the temperature of the substrate.

The beam splitter 622 is configured to sample a portion of the emitted continuous wave electromagnetic radiation by reflecting a portion of the emitted continuous wave electromagnetic radiation incident on a first substantially planar surface thereof towards the emitted power detector 620. In one embodiment, a second planar surface (not shown) of the beam splitter 622, opposite the first planar surface, is used to reflect continuous wave electromagnetic radiation reflected from the surface 224 of the substrate 208 towards the reflected power detector 618. The beam splitter is preferably disposed between the continuous wave electromagnetic radiation sources 210 and stage 204. The beam splitter 622 is also preferably coated with an anti-reflective coating, such as MgF. In use, the beam splitter 622 reflects or samples less than 1% of the continuous wave electromagnetic radiation emitted by the continuous wave electromagnetic radiation source 210.

In use, the ratio of the detected emitted power to the detected reflected power provides a measurement of the absorption at the substrate. Absorption is the process by which radiant energy is absorbed, converted into other forms of energy, such as heat, and then reradiated at a longer wave length, according to Planck's law for thermal radiation.

In one embodiment, the emitted power detector 620 and the reflected power detector 618 detect continuous wave electromagnetic radiation. In one embodiment, at least one reflected power detector 618 is configured as a temperature detector to detect the temperature on the surface 224 of the substrate 208 at the line of continuous wave electromagnetic radiation 222. To detect temperature, the temperature detector detects continuous wave electromagnetic wavelengths. Detecting the electromagnetic wavelengths is achieved by positioning a filter 624 between the reflected continuous wave electromagnetic radiation and the reflected power detector 618.

The reflected power detector 618 and emitted power detector 620 also preferably include pinhole apertures (not shown) to maximize the single detected while minimizing the collection of any stray radiation that may be scattered within the optics due to the non-zero reflectivity of the lenses in the apparatus.

In one embodiment, which may include 15 and 16 opposing laser diode modules, 15 pairs of reflected power detectors 618 and emitted power detectors 620 are preferably provided. Every other reflected power detector 618 is preferably configured as a temperature detector, as described above.

In another embodiment, reflectors 626 are positioned between the focusing optics 212 and the substrate 208. The reflectors 626 are configured to reflect radiation reflected from the surface of the substrate back to the line of continuous wave electromagnetic radiation. In a preferred embodiment, the reflectors 626 are cylindrical mirrors with center of curvature at the focus of the lens.

Figure 7:
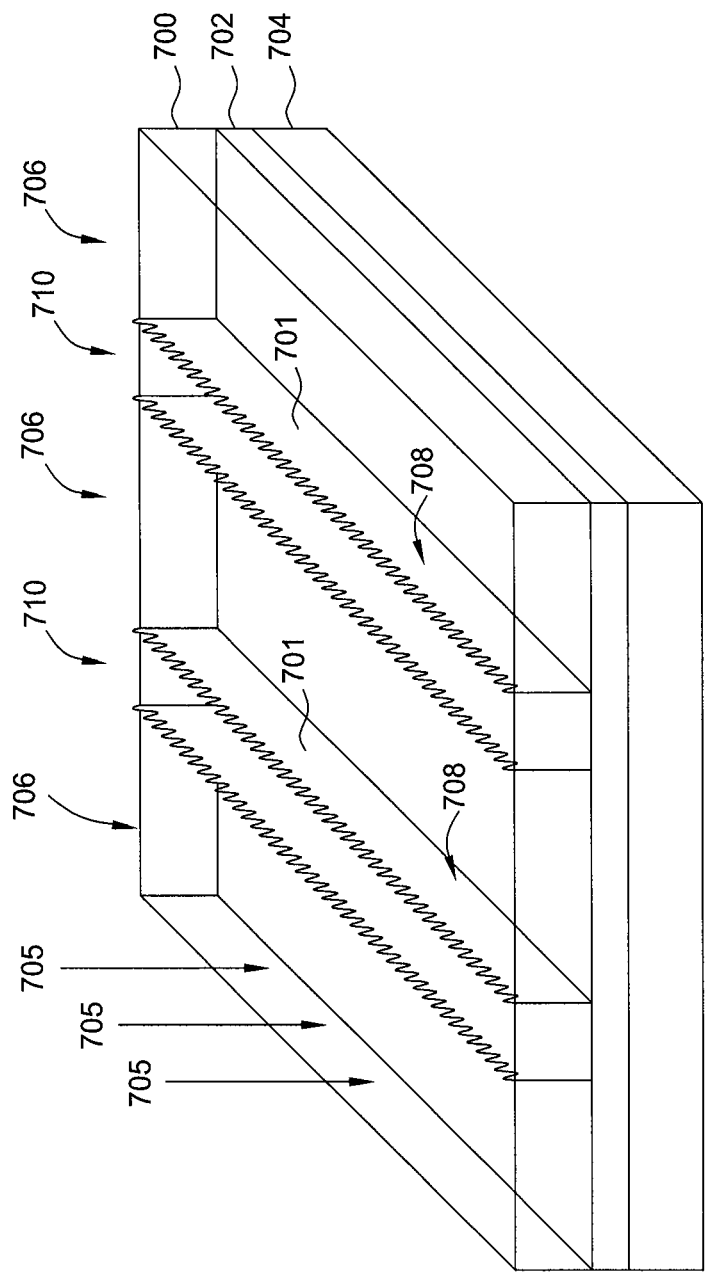
FIG. 7 depicts a photoresist layer on a material layer formed on a substrate during a photolithography exposure process with an electric field applied thereto.

FIG. 7 depicts a photoresist layer 700 on a material layer 702 formed on a substrate 704 during a photolithography exposure process. As discussed above, an electric field from the electrode assembly 201 is applied during a post exposure baking process. In one embodiment, the electric field may be parallel to the surface of the substrate 704. In another embodiment, the electric field may be perpendicular to the surface of the substrate 704. In yet another embodiment, the electric field may be between 0 degrees and 90 degrees with respect to the surface of the substrate 704. During the lithographic exposure process, radiation 705 is directed to an irradiated region 706 of the photoresist layer 700. Photoacid 708 is generated in the irradiated region 706 in the photoresist layer 700 when photoacid generator is exposed to the radiation 705, such that latent image lines 701 are formed in the photoresist layer 700.

In a conventional process, photoacid is primarily generated in the irradiated region 706 of the photoresist layer 700 during the light exposure processing. During the post-exposure bake process, movement of the photoacid is generally random and the interface between areas within the photoresist layer 700 that include the generated photoacid and areas that do not include the generated photoacid comprise an unclear boundary. For example the random movement may result in at least a portion of the photoacid diffusing into a second region 710 that may not be irradiated. Such photoacid drift may result in line edge roughness, resolution loss, photoresist footing, and profile deformation, which may cause inaccurate transfer of features to the underlying material layer 702. The inaccurate transfer of features could lead to device failure.

By applying the electric field described above to the photoresist layer 700 during the post-exposure bake process, distribution of photoacid in the irradiated region may be efficiently controlled and confined. The electric field as applied to the photoresist layer 700 may move photoacid in vertical directions with minimal lateral motion. Thus, the photoacid generally does not diffuse into the adjacent second regions 710 that are not irradiated. Generally, photoacid has a certain polarity that may be affected by an electric field applied thereto. Such an applied electric field will orient photoacid molecules in directions that are in accordance with the electric field. When such electric field is applied the photoacid moves in a desired direction such that the photoacid generally does not cross into the second regions 710.

Figure 8:
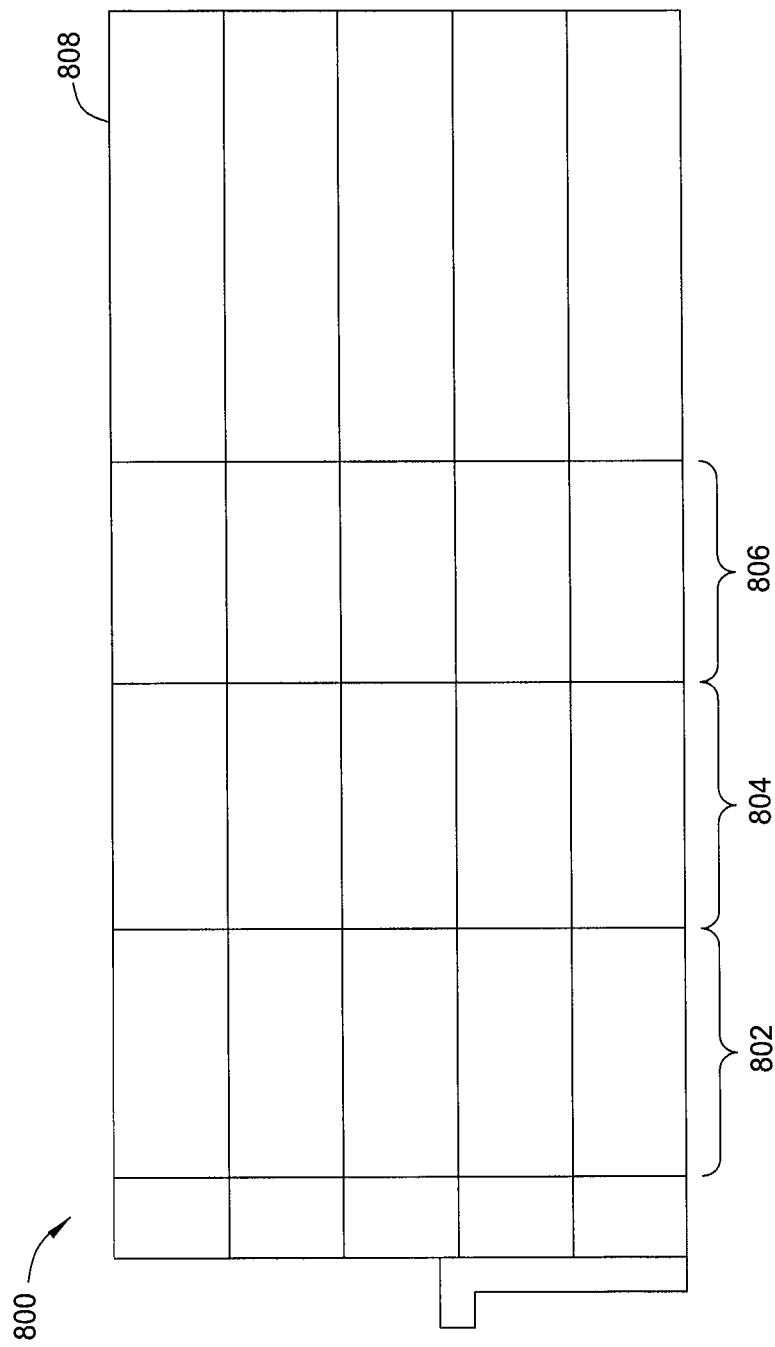
FIG. 8 depicts a track lithography tool, according to one embodiment of the invention.

FIG. 8 illustrates one embodiment of a track lithography tool 800. The track lithography tool 800 is a cluster tool that may be used to deposit and develop a photoresist material. In one embodiment, the track lithography tool 800 includes a front end module 802, a central module 804, and a rear module 806. The front end module 802 may be used to accept one or more cassettes (not shown) of substrates (not shown) that are to be processed in the track lithography tool. The front end module 802 also includes multiple processing chambers that are adapted to perform processing steps found in the substrate processing sequence. For example, the front end module 802 may include chambers such as a bake chamber, a chill chamber, or the like.

The central module 804 includes a plurality of processing chambers that are adapted to perform various processing steps in the substrate processing sequence. For example, the central module 804 may include a coater/developer chamber, a bake chamber, a chill chamber, or the like.

The rear module 806 includes a plurality of processing chambers that are adapted to perform various processing steps found in the substrate processing sequence. For example, the rear module 806 may include a coater developer chamber, a bake chamber, a chill chamber, or the like. In one embodiment, a robot (not shown) is adapted to transfer substrate between the rear module 806 and a stepper/scanner 808. The stepper/scanner 808, which may be purchased from Canon USA, Inc. of San Jose, Calif., Nikon Precision Inc. of Belmont, Calif., or ASML US, Inc. of Tempe, Ariz., is a lithographic projection apparatus used, for example, in the manufacture of integrated circuits (ICs). The stepper/scanner 808 exposes a photosensitive material (photoresist), deposited on the substrate in the track lithography tool 800, to some form of electromagnetic radiation to generate a circuit pattern correspondent to an individual layer of the IC device to be formed on the substrate surface.

In one embodiment, the processing chamber 200, 400, or 500 may be placed in one of the modules 802, 804, 806 so that photoacid distribution/diffusion may be controlled in a photoresist layer during a post-baking process.

While the foregoing is directed to specific embodiments of the present invention, other and further embodiments of the invention may be devised without departing from the basis scope thereof, and the scope thereof is determined by the claims that follow.

What is claimed is:

1. A processing chamber for processing a substrate, the processing chamber comprising:
   a stage with a substrate support surface;
   a continuous wave electromagnetic module configured to heat a surface of the substrate, the continuous wave electromagnetic module comprising:
   a continuous wave electromagnetic radiation source, wherein the continuous wave electromagnetic radiation source is a continuous wave electromagnetic laser;
   a translation mechanism configured to translate the stage or the continuous wave electromagnetic radiation source; and
   a plurality of electrode assemblies surrounding the stage to create an electric field about the surface of the substrate support surface, wherein each electrode assembly includes a first electrode interleaved with a second electrode such that an opening is formed therebetween.

2. The processing chamber of claim 1, wherein the continuous wave electromagnetic module further comprises:
   a focusing optic, wherein the focusing optic is disposed between the continuous electromagnetic wave source and the stage.

3. The processing chamber of claim 2, wherein the focusing optic includes a collimator.

4. The processing chamber of claim 1, wherein the plurality of electrode assemblies are positioned outside the processing chamber.

5. The processing chamber of claim 1, wherein the plurality of electrode assemblies generate an electric field substantially parallel to the substrate support surface.

6. The processing chamber of claim 1, wherein the plurality of electrode assemblies generate an electric field substantially perpendicular to the substrate support surface.

7. The processing chamber of claim 1, wherein the plurality of electrode assemblies generate an electric field between 0 and 90 degrees with respect to the substrate support surface.

8. The processing chamber of claim 1, wherein the plurality of electrode assemblies are positioned outside the processing chamber.

9. The processing chamber of claim 1, wherein the plurality of electrode assemblies generate an electric field substantially parallel to the substrate support surface.

10. The processing chamber of claim 1, wherein the plurality of electrode assemblies generate an electric field substantially perpendicular to the substrate support surface.

11. A method of processing a substrate, the method comprising:
    applying a photoresist layer to a substrate positioned in a processing chamber;
    providing an electric field to the photoresist layer disposed on the substrate with a plurality of electrode assemblies surrounding the substrate to create an electric field about a surface of the substrate, wherein each electrode assembly includes a first electrode interleaved with a second electrode such that an opening is formed therebetween;
    scanning a surface of the substrate with a continuous wave electromagnetic radiation source, wherein the continuous wave electromagnetic radiation source is a high power continuous wave electromagnetic laser; and
    selectively irradiating the surface of the substrate with the continuous wave electromagnetic radiation source.

12. The method of claim 11, wherein providing an electric field to the photoresist layer disposed on the substrate comprises:
    generating an electric field substantially parallel to a surface of the substrate.

13. The method of claim 11, wherein providing an electric field to the photoresist layer disposed on the substrate comprises:

generating an electric field substantially perpendicular to a surface of the substrate.

14. The method of claim 11, wherein providing an electric field to the photoresist layer disposed on the substrate comprises:
generating an electric field between 0 degrees and 90 degrees with respect to a surface of the substrate.

15. The method of claim 11, further comprising:
translating a line of radiation relative to the upper surface of the substrate.

16. The method of claim 11, further comprising:
altering an acid diffusion in the photoresist layer.

17. The method of claim 11, further comprising:
determining a speed of translation for the line of radiation.

18. A processing chamber for processing a substrate, the processing chamber comprising:
a stage with a substrate support surface;
a continuous wave electromagnetic module configured to heat a surface of the substrate, the continuous wave electromagnetic module comprising:
a continuous wave electromagnetic radiation source, wherein the continuous wave electromagnetic radiation source is a continuous wave electromagnetic laser; and
a focusing optic, wherein the focusing optic is disposed between the continuous wave electromagnetic radiation source and the stage;
a translation mechanism configured to translate the stage or the continuous wave electromagnetic radiation source; and
a plurality of electrode assemblies surrounding the stage to create an electric field about the surface of the substrate support surface, wherein each electrode assembly includes a first electrode interleaved with a second electrode such that an opening is formed therebetween.

19. The processing chamber of claim 18, wherein the focusing optic includes a collimator.

20. The processing chamber of claim 18, wherein the processing chamber is positioned in a track lithography tool.

* * * * *